United States Patent
Umise et al.

(10) Patent No.: US 12,261,078 B2
(45) Date of Patent: Mar. 25, 2025

(54) PROCESSING METHOD AND PROCESSING APPARATUS

(71) Applicant: Tokyo Electron Limited, Tokyo (JP)

(72) Inventors: Takuya Umise, Nirasaki (JP); Masato Shinada, Tokyo (JP); Tetsuya Miyashita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 441 days.

(21) Appl. No.: 17/657,962

(22) Filed: Apr. 5, 2022

(65) Prior Publication Data

US 2022/0328343 A1 Oct. 13, 2022

(30) Foreign Application Priority Data

Apr. 13, 2021 (JP) ................ 2021-067478

(51) Int. Cl.
*H01L 21/68* (2006.01)
*H01L 21/687* (2006.01)

(52) U.S. Cl.
CPC .. *H01L 21/68785* (2013.01); *H01L 21/68735* (2013.01); *H01L 21/68742* (2013.01);
(Continued)

(58) Field of Classification Search
CPC ......... H01L 21/68785; H01L 21/68742; H01L 21/68792; H01L 21/67109; H01L 21/6719; H01L 21/6838; H01L 21/68771; H01L 21/67069; H01L 21/67051; H01L 21/68; H01L 21/67742; H01L 21/68707; H01L 21/3065; H01L 21/67017; H01L 21/68757; H01L 21/31116; H01L 21/02164; H01L 21/6708; H01L 21/67207; H01L 21/02274; H01L 21/0228; H01L 21/30655;
(Continued)

(56) References Cited

U.S. PATENT DOCUMENTS

| 5,826,129 A * | 10/1998 | Hasebe | H01L 21/67178 414/416.03 |
| 2012/0309191 A1* | 12/2012 | Miura | H01L 21/28512 438/655 |
| 2017/0283940 A1* | 10/2017 | Nakamura | H01J 37/32798 |

FOREIGN PATENT DOCUMENTS

| JP | 2000-109975 A | 4/2000 |
| JP | 2001-335927 A | 12/2001 |
| JP | 2017-228579 A | 12/2017 |

* cited by examiner

*Primary Examiner* — Saul Rodriguez
*Assistant Examiner* — Lucia Elba Rodriguez
(74) *Attorney, Agent, or Firm* — Armstrong Teasdale LLP

(57) ABSTRACT

A processing method for processing a substrate includes: a first arrangement step of mounting, on a stage provided in a processing container to mount the substrate on the stage, a plate-shaped protective member which is prepared in advance at a location in the processing container different from a location on the stage and which is configured to protect an upper surface of the stage; an adjustment step of adjusting a distance between the stage and an annular cover member provided above an edge portion of the stage to a second distance different from a first distance between the stage and the cover member when the substrate is processed; and a pretreatment step of performing a pretreatment in the processing container to change a state in the processing container to a predetermined state, wherein the protective member has a thickness different from a thickness of the substrate.

11 Claims, 12 Drawing Sheets

(52) U.S. Cl.
CPC ............... H01L 21/68764 (2013.01); *H01L 2221/68345* (2013.01)

(58) Field of Classification Search
CPC ......... H01L 21/67126; H01L 21/68728; H01L 21/28556; H01L 21/67161; H01L 21/67259; H01L 21/67748; H01L 21/683; H01L 21/02532; H01L 21/67778; H01L 21/76843; H01L 21/0262; H01L 21/02063; H01L 21/67167; H01L 21/67253; H01L 21/76855; H01L 21/0217; H01L 21/67265; H01L 21/67745; H01L 21/68714; H01L 21/02595; H01L 21/2686; H01L 21/28518; H01L 21/28562; H01L 21/76846; H01L 21/0206; H01L 21/02211; H01L 21/02216; H01L 21/2855; H01L 21/67173; H01L 21/67288; H01L 21/67706; H01L 21/681; H01L 21/687; H01L 21/68721; H01L 21/78; H01L 29/665; H01L 29/78; H01L 21/67028; H01L 21/02041; H01L 21/02057; H01L 21/32137; H01L 21/67092; H01L 21/67294; H01L 22/12; H01L 21/02087; H01L 21/28512; H01L 21/304; H01L 21/67023; H01L 21/67098; H01L 21/67178; H01L 21/67219; H01L 21/67754; H01L 21/67781; H01L 2223/54493; H01L 21/02068; H01L 21/02238; H01L 21/02255; H01L 21/31144; H01L 21/324; H01L 21/67034; H01L 21/6715; H01L 21/67724; H01L 21/6776; H01L 21/67766; H01L 21/76816; H01L 21/0209; H01L 21/02175; H01L 21/02271; H01L 21/046; H01L 21/0485; H01L 21/308; H01L 21/3081; H01L 21/32134; H01L 21/67184; H01L 21/673; H01L 21/677; H01L 21/67736; H01L 21/67739; H01L 21/76802; H01L 21/76838; H01L 21/76873; H01L 21/76879; H01L 21/76889; H01L 21/02186; H01L 21/02356; H01L 21/26; H01L 21/2636; H01L 21/268; H01L 21/28176; H01L 21/02167; H01L 21/02205; H01L 21/02266; H01L 21/0234; H01L 21/68735; H01L 21/68764; H01L 2221/68345; C23C 14/34; C23C 14/505; C23C 14/564

See application file for complete search history.

PROCESSING METHOD AND PROCESSING APPARATUS

CROSS-REFERENCE TO RELATED APPLICATION

This application is based upon and claims the benefit of priority from Japanese Patent Application No. 2021-067478, filed on Apr. 13, 2021, the entire contents of which are incorporated herein by reference.

TECHNICAL FIELD

The present disclosure relates to a processing method and a processing apparatus.

BACKGROUND

In a semiconductor manufacturing process, a substrate is subjected to processing such as film formation and etching. For example, Patent Document 1 discloses a film forming system that forms a film on a substrate by sputtering.

PRIOR ART DOCUMENT

Patent Document

Patent Document 1: Japanese Laid-Open Patent Publication No. 2017-228579

SUMMARY

According to one embodiment of the present disclosure, a processing method performed in a processing apparatus for processing a substrate, includes: a first arrangement step of mounting, on a stage provided in a processing container to mount the substrate on the stage, a plate-shaped protective member which is prepared in advance at a location in the processing container different from a location on the stage and which is configured to protect an upper surface of the stage on which the substrate is mounted; an adjustment step of adjusting a distance between the stage and an annular cover member provided above an edge portion of the stage to a second distance different from a first distance between the stage and the cover member when the substrate is processed; and a pretreatment step of performing a pretreatment in the processing container to change a state in the processing container to a predetermined state, wherein the protective member has a thickness different from a thickness of the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
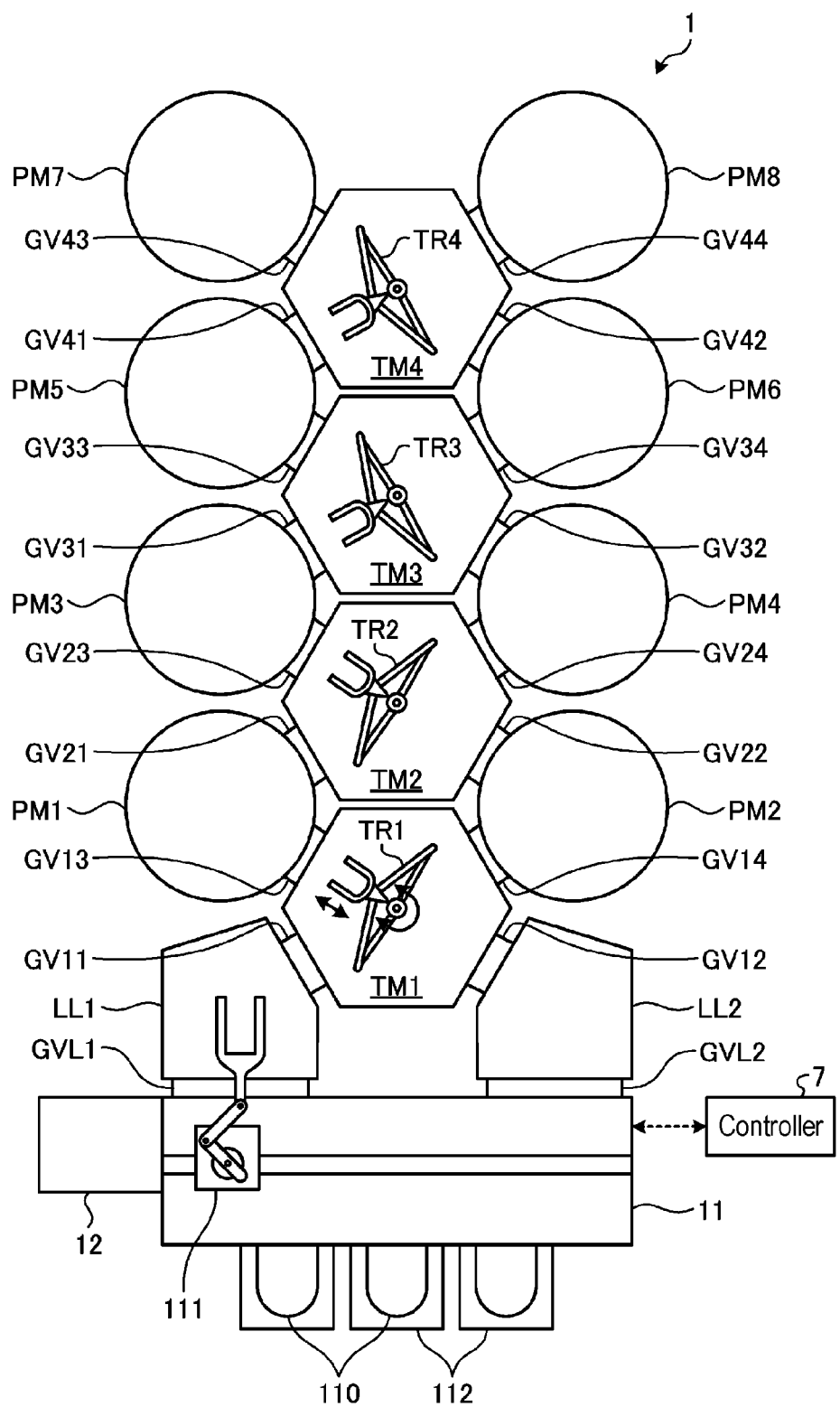
FIG. 1 is a system configuration diagram showing an example of a film forming system according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a processing method and a processing apparatus will be described in detail with reference to the drawings. It should be noted that the following embodiments do not limit the processing method and the processing apparatus disclosed herein.

In a processing apparatus for processing a substrate, a pretreatment may be performed in a processing container to bring the state in the processing container into a predetermined state before starting the processing of the substrate. For example, in a processing apparatus that forms a film on a substrate by sputtering, in order to remove impurities and the like adhering to the surface of a target, pre-sputtering for scraping the surface of the target using plasma may be performed before a substrate is loaded into a processing container. In such pre-sputtering, impurities and the like scraped from the surface of the target may adhere to the surface of the stage on which the substrate is mounted, or the surface of the stage may be damaged by the plasma. Therefore, in the pre-sputtering, the upper surface of the stage is protected in order to protect the stage.

When such stage protection is performed using a substrate, pre-sputtering cannot be started until the transfer system for transferring the substrate to the stage in the processing apparatus is operated. Therefore, the start of substrate processing is delayed, which makes it difficult to improve the substrate processing throughput. Thus, it is conceivable that a protective member for protecting the stage is prepared inside the processing apparatus in advance and the pretreatment in the processing apparatus is executed before the operation of the transfer system for transferring the substrate is started.

In this regard, as the protective member prepared in advance inside the processing apparatus, it is conceivable to use the same substrate as that processed by the processing apparatus. However, such a substrate may be deformed when exposed to plasma multiple times and need to be replaced frequently. If the protective member is frequently replaced, the transfer of the substrate to be processed may be delayed due to the transfer of the protective member. This makes it difficult to improve the substrate processing throughput.

Therefore, it is conceivable to use a protective member thicker than the substrate to be processed. However, if the thickness of the protective member is different from the thickness of the substrate to be processed, when the stage on which the protective member is mounted is arranged at a position where pre-sputtering is performed, the protective member and the mask for protecting the stage may interfere with each other. If the protective member and the mask interfere with each other, the mask may be deformed or damaged, or the protective member and the mask may rub against each other to generate particles. Therefore, there is a demand for a technique capable of improving the substrate processing throughput while preventing the protective member and the mask from interfering with each other.

[Configuration of Film Forming System 1]

FIG. 1 is a system configuration diagram showing an example of a configuration of a film forming system 1 according to an embodiment of the present disclosure. As shown in FIG. 1, for example, the film forming system 1 includes a loader module 11, an aligner 12, load lock modules LL1 to LL2, vacuum transfer modules TM1 to TM4, and process modules PM1 to PM8. In the following, when the load lock modules LL1 to LL2 are generically referred to without distinction, they will be described as lock module LL, and when the vacuum transfer modules TM1 to TM4 are generically referred to without distinction, they will be described as vacuum transfer module TM. Further, in the following, when the process modules PM1 to PM8 are generically referred to without distinction, they will be described as process module PM. In the example of FIG. 1, two load lock modules LL are provided in the film forming system 1. However, the number of load lock modules LL provided in the film forming system 1 may be less than two or more than one. Further, in the example of FIG. 1, four vacuum transfer modules TM are provided in the film forming system 1. However, the number of vacuum transfer modules TM provided in the film forming system 1 may be less than four or more than four. Moreover, in the example of FIG. 1, eight process modules PM are provided in the film forming system 1. However, the number of process modules PM provided in the film forming system 1 may be less than eight or more than eight.

The loader module 11 includes a transfer device 111 arranged in a housing having an air atmosphere. The transfer device 111 includes an articulated robot arm, an end effector attached to the tip of the robot arm to perform transfer of the substrate W, and a drive device for driving the robot arm.

On the side wall of the housing constituting the loader module 11, ports 112, on which a FOUP (Front Open Unified Pod) 110 capable of accommodating substrates W (e.g., 25) is set, are arranged. The FOUP 110 set in the port 112 accommodates the substrates W before or after a film forming process. The transfer device 111 in the loader module 11 transfers the substrate W among each FOUP 110 set in the port 112, the aligner 12, and the load lock module LL.

The aligner 12 performs pre-alignment to align the orientation of the substrate W taken out from the FOUP 110 and not yet loaded into the load lock module LL.

Each load lock module LL has a chamber that can be depressurized. The load lock module LL1 is connected to the loader module 11 via a gate valve GVL1, and the load lock module LL2 is connected to the loader module 11 via a gate valve GVL2. A vacuum pump and a leak valve (not shown) for switching the inside of the load lock module LL between an air atmosphere and a vacuum atmosphere are connected to the chamber of the load lock module LL. Further, the load lock module LL1 is connected to the vacuum transfer module TM1 via a gate valve GV11, and the load lock module LL2 is connected to the vacuum transfer module TM1 via a gate valve GV12.

Since the respective vacuum transfer modules TM have almost the same configuration as one another, the vacuum transfer module TM1 will be mainly described below. The vacuum transfer module TM1 has, for example, a chamber having a hexagonal plan-view shape. A transfer device TR1 is provided in the chamber of the vacuum transfer module TM1. The inside of the chamber of the vacuum transfer module TM1 is evacuated, and the substrate W loaded into the chamber is transferred by the transfer device TR1 under a vacuum atmosphere.

The transfer device TR1 includes an articulated robot arm, an end effector attached to the tip of the robot arm to execute the transfer of the substrate W, and a drive device for driving the robot arm. The articulated robot arm can be rotated around a vertical axis and can be extended and retracted between an extended position horizontally apart from the vertical axis and a retracted position close to the vertical axis.

In the present embodiment, the vacuum transfer modules TM are arranged in a row from the loader module 11 with one side of each hexagonal chamber facing toward the loader module 11. The vacuum transfer module TM1 closest to the loader module 11 is connected to the load lock module LL1 via a gate valve GV11 and is connected to the load lock module LL2 via a gate valve GV12. Further, the vacuum transfer module TM1 is connected to the process module PM1 via a gate valve GV13 and is connected to the process module PM2 via a gate valve GV14.

The process module PM1 is connected to the vacuum transfer module TM2 via a gate valve GV21, and the process module PM2 is connected to the vacuum transfer module TM2 via a gate valve GV22. A transfer device TR2 is provided in the chamber of the vacuum transfer module TM2. The vacuum transfer module TM2 is connected to the process module PM3 via a gate valve GV23 and is connected to the process module PM4 via a gate valve GV24. The PM3 is connected to the vacuum transfer module TM3 via a gate valve GV31, and the process module PM4 is connected to the vacuum transfer module TM3 via a gate valve GV32. A transfer device TR3 is provided in the chamber of the vacuum transfer module TM3. The vacuum transfer module TM3 is connected to the process module PM5 via a gate valve GV33 and is connected to the process module PM6 via a gate valve GV34. The process module PM5 is connected to the vacuum transfer module TM4 via a gate valve GV41, and the process module PM6 is connected to the vacuum transfer module TM4 via a gate valve GV42. A transfer device TR4 is provided in the chamber of the vacuum transfer module TM4. The vacuum transfer module TM4 is connected to the process module PM7 via a gate valve GV43 and is connected to the process module PM8 via a gate valve GV44.

Each process module PM processes the substrate W. In the present embodiment, each of the process modules PM1 to PM5 and PM7 to PM8 is configured as a film forming apparatus for forming a metal film on the surface of the substrate W, and the process module PM6 is configured as a heat treatment apparatus for heat-treating the substrate W on which the metal film is formed. Which of the process modules PM1 to PM8 is to be used as the film forming apparatus and which of the process modules PM1 to PM8 is to be used as an apparatus different from the film forming apparatus (e.g., a heat treatment apparatus or an oxidizing apparatus for oxidizing a metal film) are determined by the content of the processing to be carried out with respect to the substrate W and are not particularly limited. All the process modules PM1 to PM8 may be used as film forming apparatuses.

The controller 7 includes a memory, a processor, and an input/output interface. Data such as recipes or the like and programs are stored in the memory. The memory is, for example, a RAM (Random Access Memory), a ROM (Read Only Memory), an HDD (Hard Disk Drive), an SSD (Solid State Drive), or the like. The processor controls each part of the film forming system 1 via the input/output interface based on the data such as the recipes stored in the memory by executing the programs read from the memory. The processor is a CPU (Central Processing Unit), a DSP (Digital Signal Processor), or the like.

Figure 2:
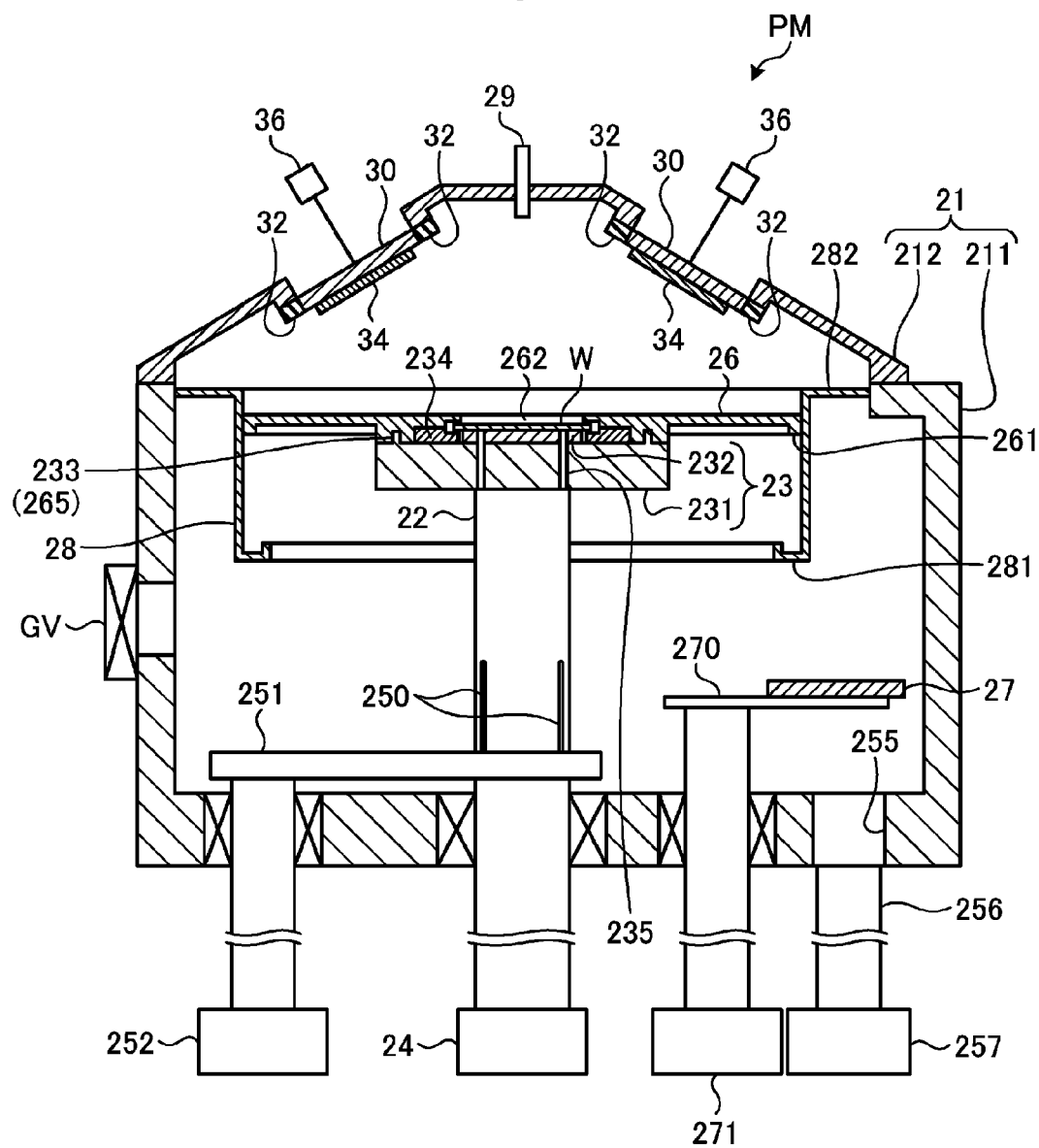
FIG. 2 is a schematic cross-sectional view showing an example of a process module.

Next, the process module PM configured as a film forming apparatus will be described with reference to FIG. 2. FIG. 2 is a schematic cross-sectional view showing an example of the process module PM. The process module PM illustrated in FIG. 2 is configured as a sputtering apparatus that forms a metal film on the surface of the substrate W by sputtering. The process module PM is an example of a processing apparatus.

The process module PM includes a processing container 21, a stage 23, and a target 34. The stage 23 is provided in the processing container 21, and the substrate W on which a film is to be formed is mounted on the stage 23. The surface of the target 34 is exposed inside the processing container 21 to emit a metal toward the substrate W mounted on the stage 23. The processing container 21 includes a body portion 211 which is a substantially cylindrical container having an open upper portion, and a lid portion 212 which closes the opening of the body portion 211. An opening is formed in the side wall of the body portion 211 and is opened and closed by the gate valve GV.

The stage 23 includes a base member 231 and an electrostatic chuck 232 for fixing the substrate W to the stage 23. The base member 231 is composed of a substantially disc-shaped member having a diameter larger than that of the substrate W. The base member 231 includes a temperature adjustment module (not shown) configured to adjust the temperature of at least one of the electrostatic chuck 232 and the substrate W to a predetermined temperature. The electrostatic chuck 232 is arranged on the upper surface of the base member 231. The electrostatic chuck 232 has a configuration in which electrodes (not shown) are arranged in a ceramic layer having a substantially disc shape and having a diameter smaller than that of the substrate W. By applying a voltage to the electrodes in the electrostatic chuck 232 from a DC power source (not shown), the substrate W can be attracted to and held on the upper surface of the electrostatic chuck 232. The base member 231 and the electrostatic chuck 232 have through-holes 235 for passing lift pins 250 which will be described later.

An annular shield ring 234 for preventing the metal emitted from the target 34 from adhering to the surface of the base member 231 is arranged on the upper surface of the stage 23. The shield ring 234 is arranged on the base member 231 so as to surround the periphery of the electrostatic chuck 232 in order to prevent the base member 231 from being exposed toward the opening 262 of a mask 26 described later.

A rotary shaft 22 for rotating the stage 23 about the central axis of the stage 23 is connected to the central portion of the lower surface of the base member 231 of the stage 23. The rotary shaft 22 is provided so as to extend vertically downward from the portion connected to the base member 231. The rotary shaft 22 penetrates the bottom wall of the body portion 211 of the processing container 21 and is connected to the driver 24. A sealing member for hermetically maintaining the internal space of the processing container 21 is provided at a position where the rotary shaft 22 penetrates the body portion 211.

By rotating the rotary shaft 22 about the central axis of the stage 23, the driver 24 can rotate the substrate W attracted to and held on the electrostatic chuck 232 of the stage 23. Further, the driver 24 can vertically move the rotary shaft 22 to move the stage 23 between a transfer position where the substrate W is transferred between the end effector of the transfer device TR and the stage 23 and a film forming position where a film forming process for the substrate W is performed. The driver 24 is an example of an adjustment part.

Figure 3:
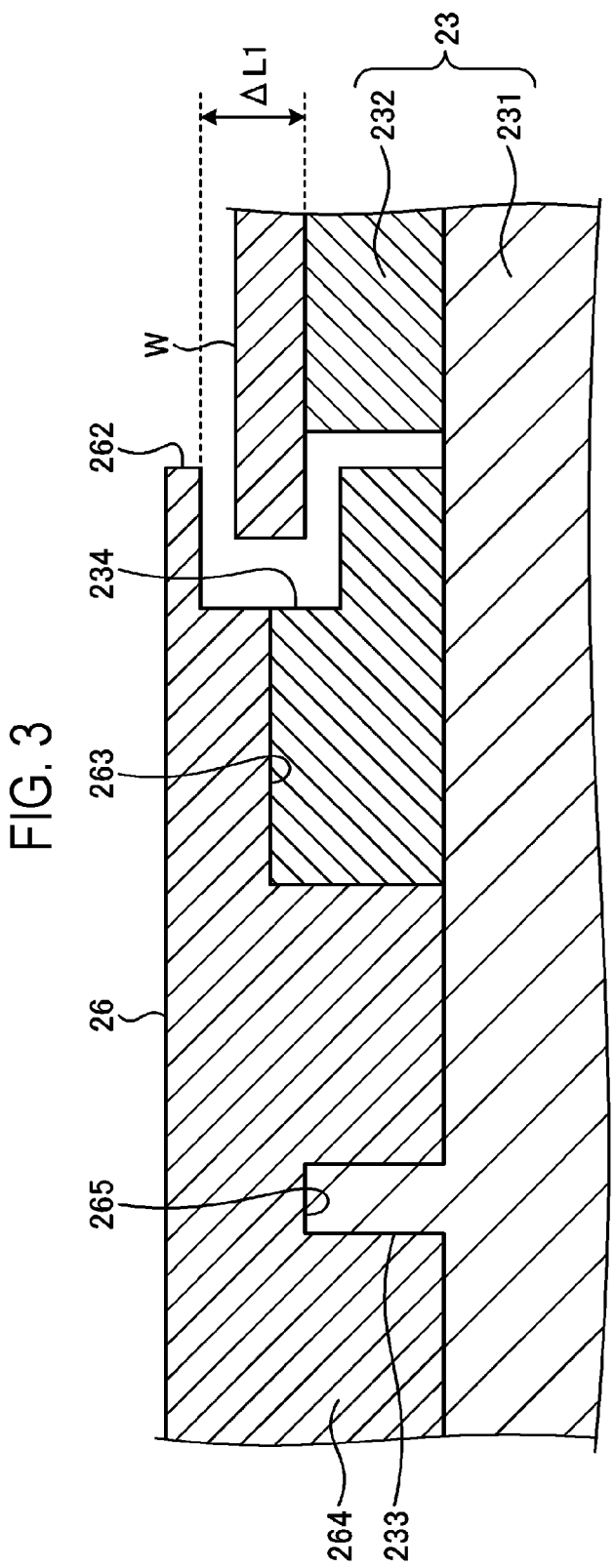
FIG. 3 is an enlarged cross-sectional view showing an example of a detailed structure of an edge portion of a stage.

Further, in the processing container 21, a mask 26 for forming a non-film forming region (a region in which a metal film is not formed) at an edge portion of the substrate W is arranged. The mask 26 is an example of a cover member. The mask 26 is composed of a substantially annular member having a substantially circular opening 262 corresponding to a metal film formation region and having a diameter smaller than the diameter of the substrate W. The mask 26 is provided above the edge portion of the stage 23. On the lower surface of the mask 26, for example, as shown in FIG. 3, a recess 263 capable of accommodating the electrostatic chuck 232, the shield ring 234, and the edge portion of the substrate W on the electrostatic chuck 232 is formed. The outer edge portion 261 of the mask 26 protrudes downward. The distance in the vertical direction between the electrostatic chuck 232 and the edge of the opening 262 of the mask 26 when performing a film forming process on the substrate W is defined as $\Delta L1$. $\Delta L1$ is an example of a first distance.

Figure 4:
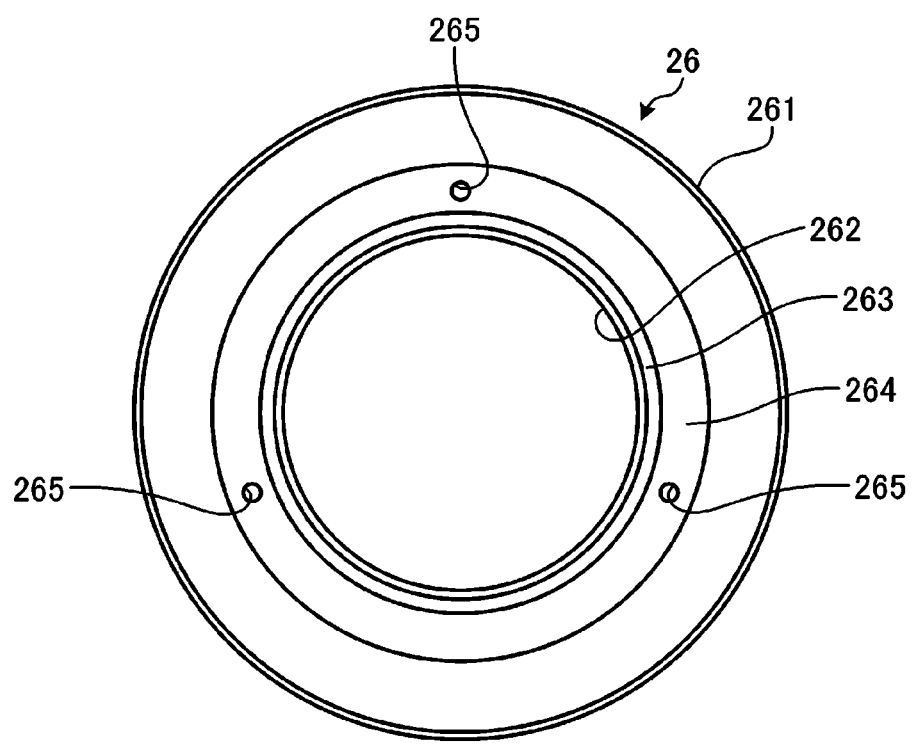
FIG. 4 is a bottom view showing an example of a structure of a lower surface of a mask.
Figure 5:
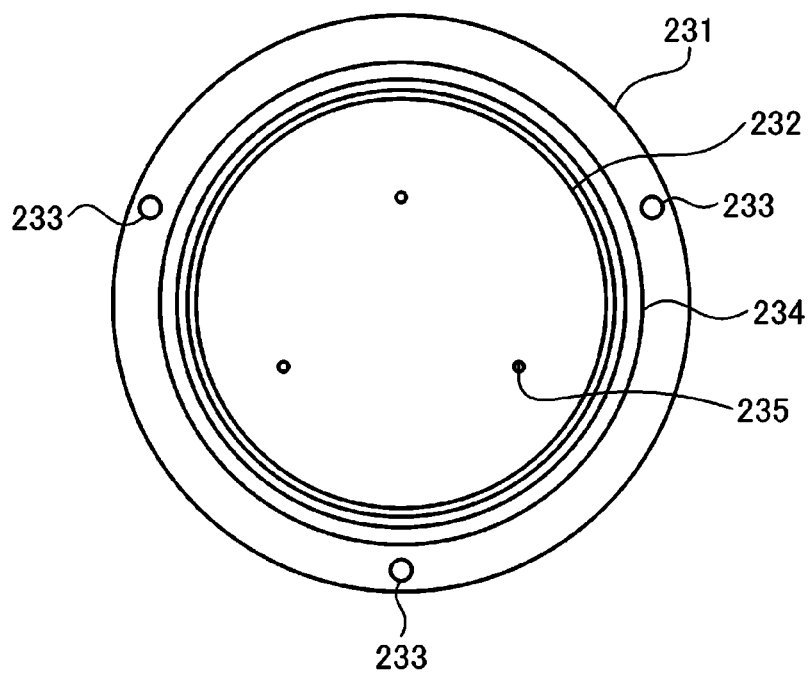
FIG. 5 is a plan view showing an example of a structure of an upper surface of a stage.

For example, as shown in FIG. 4, an annular protrusion 264 is formed around the recess 263. FIG. 4 is a bottom view showing an example of the structure of the lower surface of the mask 26. Recesses 265 (three, in the example of FIG. 4) are formed along the circumferential direction on the lower surface of the protrusion 264 facing the edge portion of the stage 23. The number of recesses 265 formed on the lower surface of the protrusion 264 may be less than three or more than three. On the other hand, for example, as shown in FIG. 5, protrusions 233 (three, in the example of FIG. 5) are provided on the upper surface of the stage 23 at the positions corresponding to the recesses 265. FIG. 5 is a plan view showing an example of the structure of the upper surface of the stage 23. The number of protrusions 233 formed on the upper surface of the stage 23 may be less than three or more than three. By fitting the protrusions 233 into the recesses 265 of the mask 26, the position of the stage 23 with respect to the mask 26 is restricted. The positional relationship between the protrusions 233 and the recesses 265 may be reversed. Protrusions 233 may be provided on the mask 26, and recesses 265 into which the protrusions 233 are fitted may be formed on the stage 23.

The description will be continued by returning to FIG. 2. In the processing container 21, a mask support 28 for removing the mask 26 from the stage 23 and supporting the removed mask 26 when the stage 23 descends to the delivery position is provided. The mask support 28 is composed of a substantially cylindrical member arranged so as to surround the outer peripheral surface of the mask 26. A flange 282 extending toward the outer periphery is provided on the upper portion of the mask support 28. The flange 282 is fixed to the inner wall of the body portion 211.

The mask support 28 has a substantially cylindrical internal space that extends vertically so as not to interfere with the movement of the mask 26 accompanying the ascending/descending movement of the stage 23. Further, at the lower end portion of the mask support 28, a support portion 281 protruding radially inward and having a hook-shaped vertical cross section is formed along the circumferential direction of the mask support 28. Since the support portion 281 is installed above the delivery position, when the stage 23 descends to the delivery position, the outer edge portion 261 of the mask 26 is locked to the support portion 281 of the mask support 28, whereby the mask 26 is removed from the stage 23.

Below the stage 23, a support portion 251 for supporting lift pins 250 (e.g., three lift pins 250) is provided. A driver 252 raises and lowers the support portion 251.

Further, below the mask support 28, a transfer part 270 for transferring a disc shutter 27 that protects the electrostatic chuck 232 is provided. The disc shutter 27 has a thickness different from that of the substrate W to be processed. In the present embodiment, the disc shutter 27 is thicker than the substrate W. Further, the surface of the disc shutter 27 in contact with the stage 23 is rougher than the upper surface of the stage 23 (i.e., the upper surface of the electrostatic chuck 232). This makes it possible to prevent the disc shutter 27 from slipping on the transfer part 270 or the stage 23 and shifting from a predetermined position with respect to the transfer part 270 or the stage 23. The disc shutter 27 is an example of a protective member. The transfer part 270 is driven by a driver 271. The disc shutter 27 is prepared in advance on the transfer part 270 before the processing on the substrate W is started. Therefore, the process using the disc shutter 27 can be started even before the operations of the loader module 11, the load lock module LL, and the vacuum transfer module TM are started. Further, the transfer part 270 is arranged below the mask support 28, and the mask 26 and the stage 23 are arranged in the opening of the mask support 28 while the processing on the substrate W is being performed. Therefore, it is possible to prevent the metal particles emitted from the target 34 by sputtering from adhering to the disc shutter 27 and prevent the particles adhering to the disc shutter 27 from adhering to the substrate W.

An exhaust port 255 is formed on the bottom wall of the body portion 211. An exhaust device 257 is connected to the exhaust port 255 via an exhaust pipe 256. The exhaust device 257 includes a pressure regulation valve and a vacuum pump. The pressure regulation valve regulates the pressure in the processing container 21. The vacuum pump includes a turbo molecular pump, a dry pump or a combination thereof.

A gas supply pipe 29 for supplying a gas (e.g., an argon gas) as a raw material for ions used for sputtering to the internal space of the processing container 21 is provided at a substantially central portion of the lid portion 212.

The lid portion 212 is provided with a holder 30 for holding the target 34 and a holder support portion 32 for fixing the holder 30 to the lid portion 212. The holder support portion 32 is formed of an insulator. For example, the holder support portion 32 fixes the holder 30 to the lid portion 212 while electrically insulating the metal-made holder 30 from the metal-made lid portion 212.

The holder 30 is connected to the power source 36. The power source 36 supplies a direct current or alternating current to the holder 30 to generate an electric field in the vicinity of the target 34 held by the holder 30. The electric field generated in the vicinity of the target 34 dissociates the gas supplied from the gas supply pipe 29 to generate ions. The generated ions collide with the target 34 so that metal particles as a raw material of a metal film are emitted from the target 34. The metal particles emitted from the target 34 are deposited on the substrate W through the opening 262 of the mask 26, whereby a metal film is formed on the surface of the substrate W.

[Processing Method]

Figure 6:
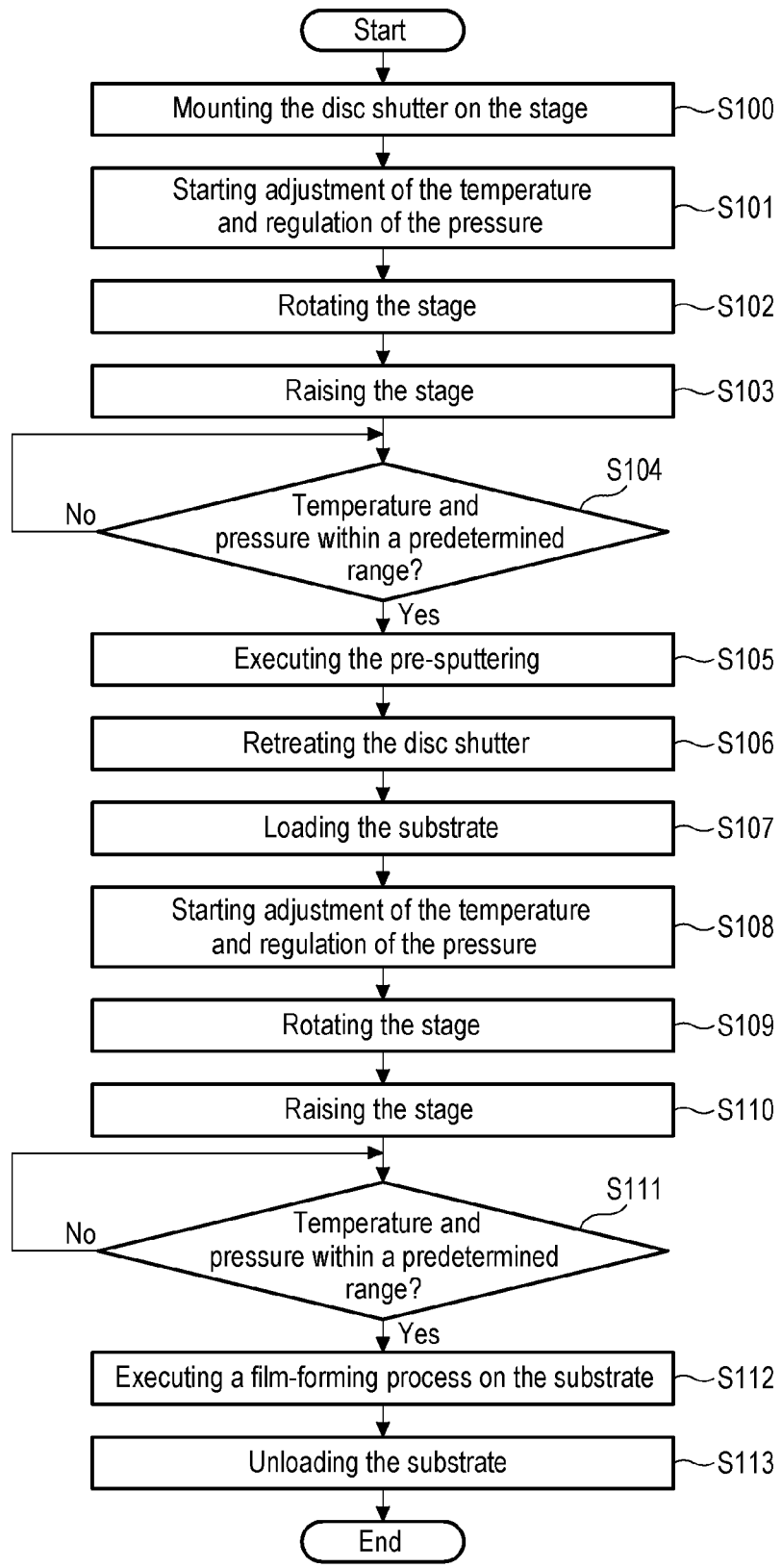
FIG. 6 is a flowchart showing an example of a processing method according to an embodiment of the present disclosure.

FIG. 6 is a flowchart showing an example of a processing method according to an embodiment of the present disclosure. FIG. 6 mainly illustrates the processing of the process module PM. Further, each step illustrated in FIG. 6 is realized by the controller 7 controlling each part of the film forming system 1.

Figure 7:
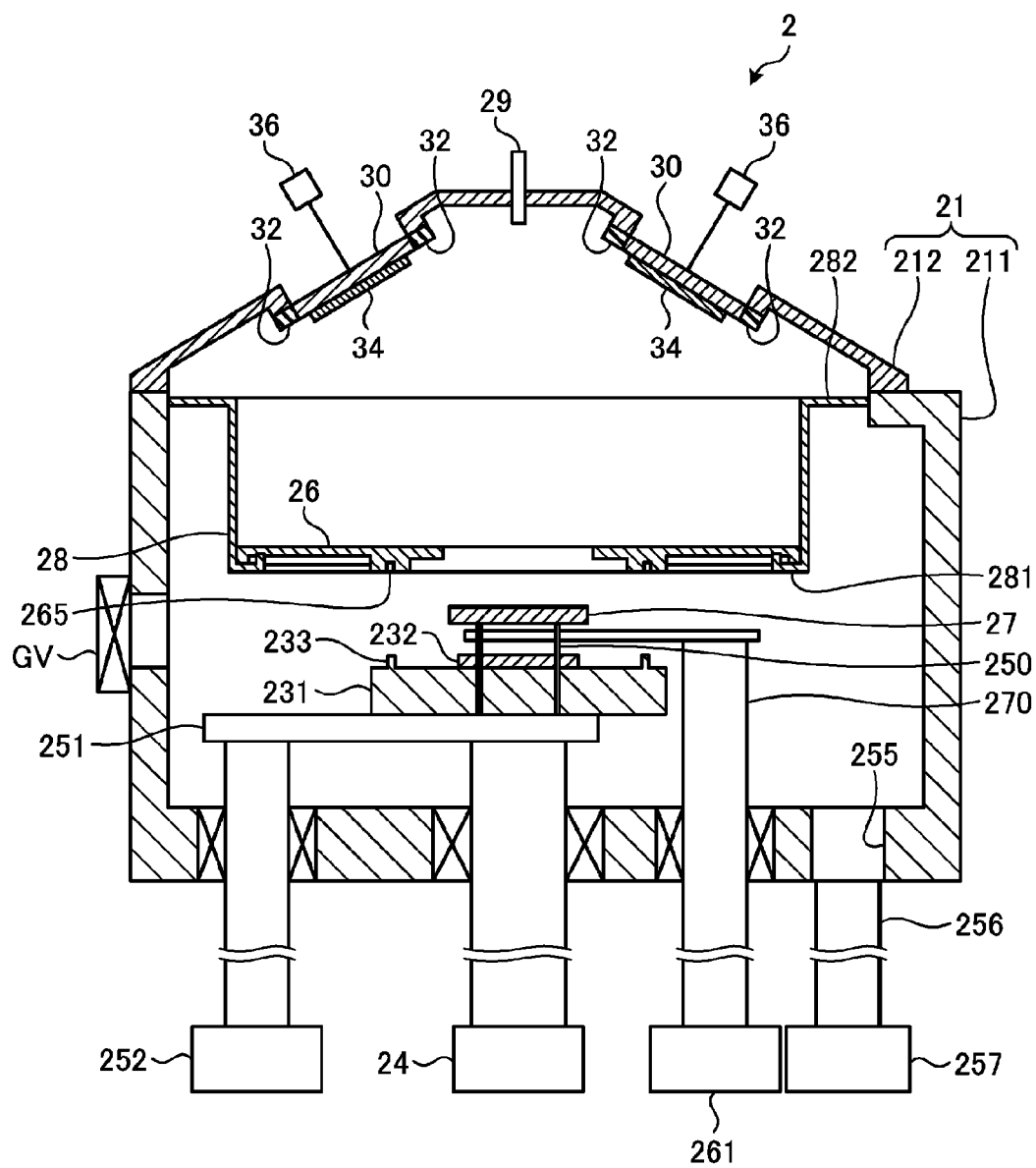
FIG. 7 is a schematic cross-sectional view showing an example of a process module which is mounting a disc shutter on a stage.

First, the disc shutter 27 is mounted on the stage 23 (S100). Step S100 is an example of a first arrangement step. In step S100, the stage 23 is lowered to the delivery position, and the support portion 251 is raised by the driver 252. As a result, the lift pins 250 pass through the base member 231 and the electrostatic chuck 232, and the tips of the lift pins 250 protrude upward from the upper surface of the electrostatic chuck 232. Then, for example, as shown in FIG. 7, the disc shutter 27 is delivered to the lift pins 250 by the transfer part 270. FIG. 7 is a schematic cross-sectional view showing an example of the process module when the disc shutter 27 is mounted on the stage 23. Then, the support portion 251 is lowered by the driver 252, and the disc shutter 27 is mounted on the stage 23.

Next, the adjustment of the temperature of the disc shutter 27 and the regulation of the pressure in the processing container 21 are started (S101). In step S101, the temperature of the disc shutter 27 is adjusted to a temperature within a predetermined range by a temperature adjustment module (not shown) arranged in the base member 231. The temperature within the predetermined range in step S101 is, for example, a temperature at which particles easily adhere to the disc shutter 27. The temperature at which particles easily adhere to the disc shutter 27 is determined by the material of the disc shutter 27 and the particles. Further, in step S101, the gas in the processing container 21 is exhausted by the vacuum pump of the exhaust device 257, and the pressure in the processing container 21 is regulated to a pressure within a predetermined range by the pressure regulation valve of the exhaust device 257. The pressure within the predetermined range in step S101 is, for example, a pressure suitable for removing deposits on the target 34.

Figure 8:
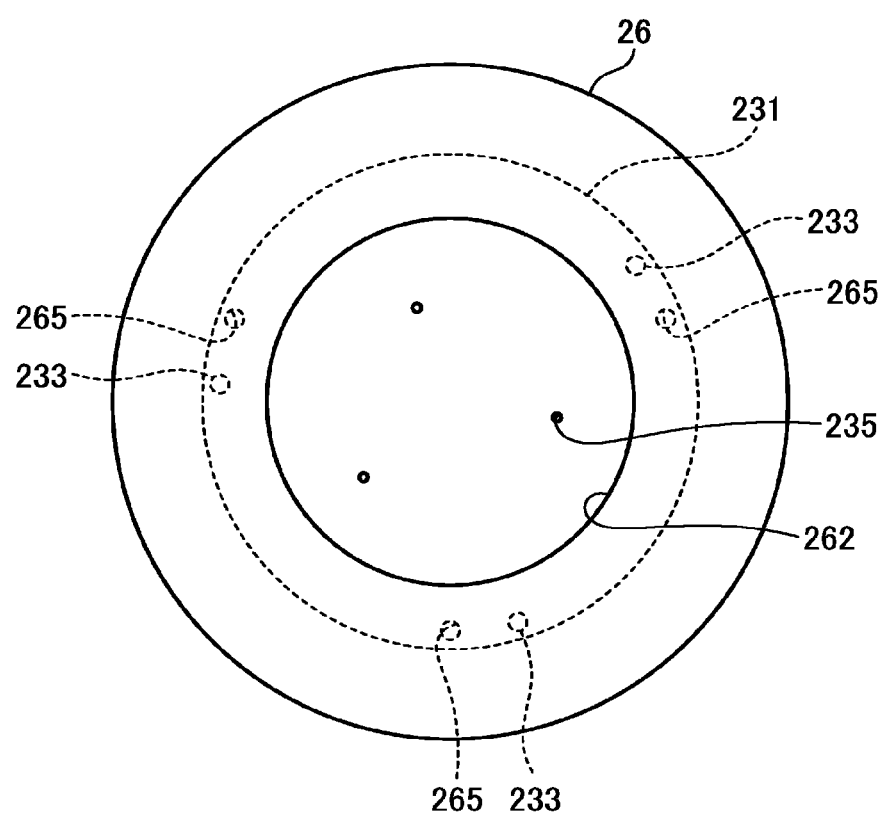
FIG. 8 is a diagram showing an example of a positional relationship between a recess of a mask and a protrusion of a stage.

Next, the driver 24 rotates the stage 23 so that the protrusions 233 of the stage 23 do not overlap with the recesses 265 of the mask 26 when viewed from the mask 26 toward the stage 23 (S102). Step S102 is an example of a second rotation step. As a result, the positional relationship between the protrusions 233 of the stage 23 and the recesses 265 of the mask 26 when viewed in a direction from the mask 26 toward the stage 23 becomes a positional relationship shown in FIG. 8, for example. FIG. 8 is a diagram showing an example of the positional relationship between the recesses 265 of the mask 26 and the protrusions 233 of the stage 23.

Figure 9:
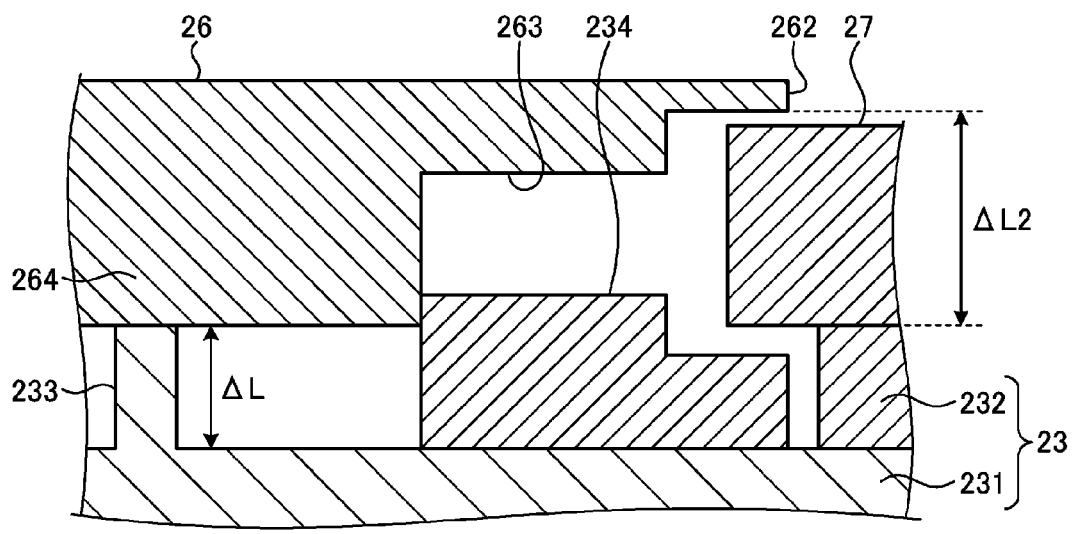
FIG. 9 is an enlarged cross-sectional view showing an example of a detailed structure of an edge portion of a stage.

Next, the driver 24 raises the stage 23 to the film forming position (S103). As the stage 23 rises, the stage 23 comes into contact with the mask 26. Then, as the stage 23 rises further, the mask 26 locked to the support portion 281 of the mask support 28 is separated from the support portion 281 and is raised together with the stage 23. At this time, since the stage 23 is rotated so that the protrusions 233 of the stage 23 do not overlap with the recesses 265 of the mask 26, the protrusions 233 of the stage 23 are in contact with the lower surface of the protrusion 264 of the mask 26, for example, as shown in FIG. 9. As a result, a gap ΔL corresponding to the height of the protrusions 233 is formed between the mask 26 and the stage 23. Thus, the vertical distance ΔL2 between the electrostatic chuck 232 and the edge of the opening 262 of the mask 26 is longer than the vertical distance ΔL1 when the protrusions 233 of the stage 23 are fitted to the recesses 265 of the mask 26, by ΔL. In the present embodiment, the length of the gap ΔL is equal to the difference in thickness between the substrate W and the disc shutter 27. ΔL2 is an example of a second distance. Further, step S103 is an example of a second setting step. In addition, steps S102 and S103 are examples of an adjustment step.

Here, when the same substrate W as the substrate W on which a film is to be formed is used as the disc shutter 27, if the substrate W is exposed to plasma many times, the substrate W may be deformed. Therefore, it is necessary to replace the substrate W frequently. If the disc shutter 27 is frequently replaced, the transfer of the substrate W to be processed may be delayed due to the transfer of the disc shutter 27, which makes it difficult to improve the substrate processing throughput. Therefore, it is conceivable to use a disc shutter 27 that is thicker than the substrate W to be processed. However, if the thickness of the disc shutter 27 is different from the thickness of the substrate W to be processed, when the stage 23 is arranged at the film forming position with the disc shutter 27 mounted on the stage 23, the disc shutter 27 may interfere with the mask 26. If the disc shutter 27 and the mask 26 interfere with each other, the mask 26 may be deformed or damaged, or the disc shutter 27 and the mask 26 may rub against each other to generate particles.

On the other hand, in the present embodiment, when the disc shutter 27 is mounted on the stage 23, the distance between the stage 23 and the mask 26 is longer than the distance when the substrate W is mounted on the stage 23. As a result, when the stage 23 is arranged at a position where pre-sputtering is performed, it is possible to prevent the disc shutter 27 and the mask 26 from interfering with each other. Further, when the disc shutter 27 is mounted on the stage 23, the distance ΔL2 between the stage 23 and the mask 26 is longer than the distance ΔL1 when the substrate W is mounted on the stage 23, by ΔL which is the difference in thickness between the substrate W and the disc shutter 27. As a result, the gap between the disc shutter 27 and the mask 26 can be narrowed to almost the same level as the gap between the substrate W and the mask 26 when the film forming process of the substrate W is performed. This makes it possible to reduce damage to the electrostatic chuck 232 and the stage 23 that may be caused by the plasma in the pre-sputtering.

The description will be continued by returning to FIG. 6. The controller 7 determines whether the temperature of the disc shutter 27 is within a predetermined range and whether the pressure inside the processing container 21 is within a predetermined range (S104). If the temperature of the disc shutter 27 is not within the predetermined range, or the pressure inside the processing container 21 is not within the predetermined range (S104: No), the process of step S104 is executed again.

On the other hand, if the temperature of the disc shutter 27 becomes a temperature within the predetermined range and the pressure in the processing container 21 becomes a pressure within the predetermined range (S104: Yes), the controller 7 executes pre-sputtering in the process module PM (S105). The pre-sputtering is an example of a pretreatment for changing the state inside the processing container 21 to a predetermined state. Further, step S105 is an example of a pretreatment step. In step S105, a gas such as an argon gas or the like is supplied from the gas supply pipe 29 into the processing container 21, and a DC or AC power is supplied from the power source 36 to the holder 30. As a result, the gas in the processing container 21 is dissociated by the electric field generated in the vicinity of the target 34 to generate ions, and the generated ions collide with the target 34 to remove impurities and the like on the surface of the target 34. The impurities removed from the target 34 are exhausted through the exhaust port 255, but a part of the impurities adheres to the inner wall of the processing container 21. In the present embodiment, the upper surface of the electrostatic chuck 232 is protected by the disc shutter 27. Therefore, the impurities removed from the target 34 adhere to the disc shutter 27, but the adhesion of the impurities to the electrostatic chuck 232 is suppressed.

Figure 10:
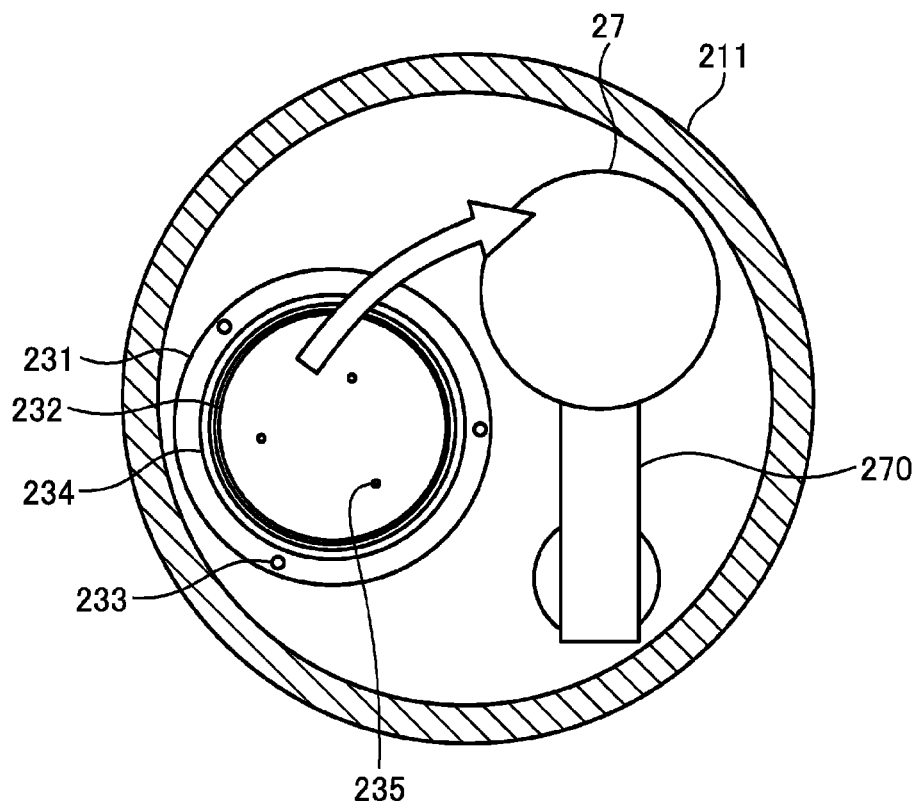
FIG. 10 is a schematic cross-sectional view showing an example of a process module which is retracting a disc shutter.

Next, the controller 7 retracts the disc shutter 27 on the stage 23 (S106). In step S106, the driver 24 lowers the stage 23 to the delivery position, and the driver 252 raises the support portion 251, whereby the lift pins 250 pass through the base member 231 and the electrostatic chuck 232. Then, the disc shutter 27 is lifted as the tips of the lift pins 250 protrude upward from the upper surface of the electrostatic chuck 232. Then, the transfer part 270 takes out the disc shutter 27 from the lift pins 250 and retracts the disc shutter 27 to a position in the processing container 21 different from the position on the stage 23, for example, as indicated by an arrow in FIG. 10. FIG. 10 is a schematic cross-sectional view showing an example of the process module for retracting the disc shutter 27.

Next, the substrate W to be processed is loaded into the processing container 21 (S107). Step S107 is an example of a second arrangement step. In step S107, the support portion 251 is raised by the driver 252, and the tips of the lift pins 250 protrude upward from the upper surface of the electrostatic chuck 232. Then, the gate valve GV is opened, and the substrate W is loaded into the processing container 21 by the transfer device TR. Then, the substrate W is delivered to the lift pins 250 by the transfer device TR, the transfer device TR is retracted to the vacuum transfer module TM, and the gate valve GV is closed. Then, the support portion 251 is lowered by the driver 252, and the substrate W is mounted on the stage 23.

Next, the adjustment of the temperature of the substrate W and the regulation of the pressure in the processing container 21 are started (S108). In step S108, the temperature of the substrate W is adjusted to a predetermined temperature by a temperature adjustment module (not shown) arranged in the base member 231. Further, in step S108, the gas in the processing container 21 is exhausted by the vacuum pump of the exhaust device 257, and the pressure in the processing container 21 is regulated to a predetermined pressure by the pressure regulation valve of the exhaust device 257. The temperature and the pressure within the predetermined range referred to in step S108 are a temperature and a pressure within a range suitable for the film forming process for the substrate W.

Next, the driver 24 rotates the stage 23 so that the protrusions 233 of the stage 23 overlap with the recesses 265 of the mask 26 when viewed in a direction from the mask 26 toward the stage 23 (S109). Step S109 is an example of a first rotation step. Then, the driver 24 raises the stage 23 to the film forming position (S110). Step S110 is an example of a first setting step. As the stage 23 rises, the protrusions 233 of the stage 23 are fitted into the recesses 265 of the mask 26. Then, as the stage 23 rises further, the mask 26 locked to the support portion 281 of the mask support 28 is separated from the support portion 281 and is raised together with the stage 23. At this time, since the protrusions 233 of the stage 23 and the recesses 265 of the mask 26 are fitted to each other, the protrusion 264 of the mask 26 is in contact with the upper surface of the base member 231, for example, as shown in FIG. 3. As a result, the distance $\Delta L1$ between the electrostatic chuck 232 and the edge of the opening 262 of the mask 26 is shorter than the distance $\Delta L2$ when the protrusions 233 of the stage 23 and the recesses 265 of the mask 26 are not fitted to each other, by the gap $\Delta L$.

Next, the controller 7 determines whether the temperature of the substrate W is within a predetermined range and whether the pressure inside the processing container 21 is within a predetermined range (S111). If the temperature of the substrate W is not within the predetermined range, or the pressure inside the processing container 21 is not within the predetermined range (S111: No), the process of step S111 is executed again.

On the other hand, if the temperature of the substrate W is within the predetermined range and the pressure inside the processing container 21 is within the predetermined range (S111: Yes), the controller 7 executes a film forming process for the substrate W in the process module PM (S112). Step S112 is an example of a processing step. In step S112, a gas such as an argon gas or the like is supplied from the gas supply pipe 29 into the processing container 21, and a DC or AC power is supplied from the power source 36 to the holder 30. As a result, an electric field is generated in the vicinity of the target 34, and the generated electric field dissociates the gas in the processing container 21 to generate ions. Then, the generated ions collide with the target 34, metal particles are emitted from the target 34, and the emitted metal particles are deposited on the surface of the substrate W.

Next, when a metal film having a predetermined thickness is formed on the surface of the substrate W, the controller 7 unloads the substrate W from the processing container 21 (S113). In step S113, the driver 24 lowers the stage 23 to the delivery position, the driver 252 raises the support portion 251, and the lift pins 250 pass through the base member 231 and the electrostatic chuck 232. Then, the substrate W is lifted as the tips of the lift pins 250 protrude upward from the upper surface of the electrostatic chuck 232. Then, the gate valve GV is opened, the transfer device TR is inserted into the processing container 21, the substrate W is delivered from the lift pins 250 to the transfer device TR, and the transfer device TR unloads the substrate W from the processing container 21. Then, the processing method shown in this flowchart ends.

In the present embodiment, step S100 is started before starting the operations of the loader module 11, the load lock module LL and the vacuum transfer module TM. As a result, the processes of steps S100 to S105 can be completed before starting the operations of the loader module 11, the load lock module LL and the vacuum transfer module TM. Thus, when the operations of the loader module 11, the load lock module LL and the vacuum transfer module TM are started, the processes of step S106 and subsequent steps can be started quickly. This makes it possible to improve the processing throughput of the substrate W.

The embodiment has been described above. As described above, the processing method according to the present embodiment, which is a processing method performed in the process module PM that processes the substrate W, includes a first arrangement step, an adjustment step and a pretreatment step. In the first arrangement step, the disc shutter 27 that protects the upper surface of the stage 23 on which the substrate W is mounted is mounted on the stage 23. The disc shutter 27 is prepared in advance at a location in the processing container 21 that is different from the location on the stage 23 which is provided in the processing container 21 and on which the substrate W is mounted. In the adjustment step, the distance between the stage 23 and the annular mask 26 provided above the edge portion of the stage 23 is adjusted to a distance $\Delta L2$ different from the distance $\Delta L1$ between the stage 23 and the mask 26 when the substrate W is processed. In the pretreatment step, pretreatment is performed in the processing container 21 in order to change the state in the processing container 21 to a predetermined state. Further, the disc shutter 27 has a thickness different from that of the substrate W. This makes it possible to improve the substrate processing throughput.

Further, in the above-described embodiment, the target 34 is exposed in the processing container 21 and is pre-sputtered in the pretreatment step. As a result, impurities can be removed from the target 34 before the film forming process for the substrate W is performed.

Further, in the above-described embodiment, in the pretreatment step, the target 34 is pre-sputtered after the temperature of the disc shutter 27 is adjusted to a predetermined temperature. As a result, the impurities removed from the target 34 by pre-sputtering and adhering to the disc shutter 27 can be prevented from being peeled off from the disc shutter 27 and re-scattering in the processing container 21.

Further, in the above-described embodiment, the disc shutter 27 is thicker than the substrate W. Moreover, the protrusions 233 are formed on the edge portion of the upper surface of the stage 23, and the recesses 265 are formed on the lower surface of the mask 26 facing the edge portion of the stage 23. The processing method includes a second arrangement step, a first rotation step, a second setting step, and a processing step. In the second arrangement step, the substrate W is mounted on the stage 23. In the first rotation step, the stage 23 is rotated so that the protrusions 233 of the stage 23 overlap with the recesses 265 of the mask 26 when viewed in a direction from the mask 26 toward the stage 23. In the first setting step, the stage 23 is brought closer to the mask 26 to fit the protrusions 233 of the stage 23 and the recesses 265 of the mask 26 to each other, so that the distance between the stage 23 and the mask 26 is set to the distance $\Delta L1$. In the processing step, the processing of the substrate W is performed. Further, the adjustment step includes a second rotation step and a second setting step. In the second rotation step, the stage 23 is rotated so that when viewed in a direction from the mask 26 toward the stage 23, the positions of the protrusions 233 of the stage 23 are arranged at the positions different from the positions of the mask 26 where the recesses 265 are provided. In the second setting step, the stage 23 and the mask 26 are brought closer to each other to bring the protrusions 233 of the stage 23 into contact with the positions of the mask 26 different from the positions where the recesses 265 are provided, whereby the distance between the stage 23 and the mask 26 is set to a distance ΔL2 longer than the distance ΔL1. This makes it possible to easily change the distance between the stage 23 and the mask 26.

Further, in the above-described embodiment, the difference between the distance ΔL1 and the distance ΔL2 is equal to the difference between the thickness of the substrate W and the thickness of the disc shutter 27. As a result, the gap between the disc shutter 27 and the mask 26 can be narrowed to almost the same level as the gap between the substrate W and the mask 26 when the film forming process for the substrate W is performed. Therefore, it is possible to reduce damage to the electrostatic chuck 232 which may be caused by plasma in the pre-sputtering.

Further, in the above-described embodiment, the surface of the disc shutter 27 in contact with the stage 23 is rougher than the upper surface of the stage 23. This makes it possible to prevent the disc shutter 27 from slipping on the stage 23 and shifting from a predetermined position with respect to the stage 23.

Further, the process module PM in the above-described embodiment includes a processing container 21, a stage 23, a mask 26, a transfer part 270, and a driver 24. The stage 23 is provided in the processing container 21 so that the substrate W is mounted on the stage 23. The mask 26 is provided above the edge portion of the stage 23 and is formed in an annular shape. The plate-shaped disc shutter 27 prepared in advance at a location in the processing container 21 different from the location on the stage 23 and configured to protect the upper surface of the stage 23 on which the substrate W is mounted is mounted on the stage 23 by the transfer part 270. When the disc shutter 27 is mounted on the stage 23, the driver 24 adjusts the distance between the stage 23 and the mask 26 to a distance ΔL2 different from the distance ΔL1 between the stage 23 and the mask 26 when the substrate W is processed. In addition, the disc shutter 27 has a thickness different from that of the substrate W. This makes it possible to improve the substrate processing throughput.

[Others]

The technique disclosed herein is not limited to the above-described embodiment, and many modifications may be made within the scope of the gist thereof.

Figure 11:
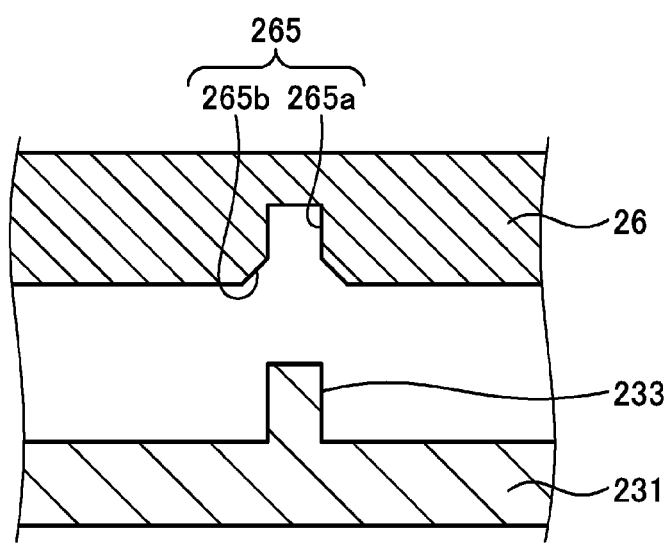
FIG. 11 is an enlarged cross-sectional view showing another example of the shape of the recess of the mask.

For example, in the above-described embodiment, the opening of the recess 265 may be provided with an inclination, for example, as shown in FIG. 11. FIG. 11 is an enlarged cross-sectional view showing another example of the shape of the recess of the mask 26. The recess 265 has a first side wall portion 265a extending in the depth direction of the recess 265, and a first inclined portion 265b formed so that the width of the recess 265 increases as the recess 265 extends from the first side wall portion 265a to the opening of the recess 265. As a result, when the stage 23 is raised, the protrusion 233 of the stage 23 is easily inserted into the recess 265 of the mask 26, which makes it possible to easily fit the protrusion 233 and the recess 265 to each other.

Figure 12:
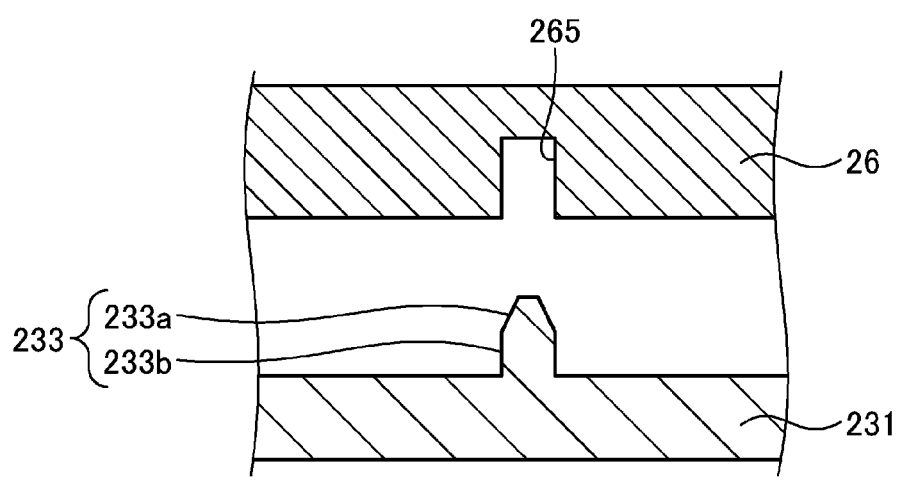
FIG. 12 is an enlarged cross-sectional view showing another example of the shape of the protrusion of the stage.
Figure 13:
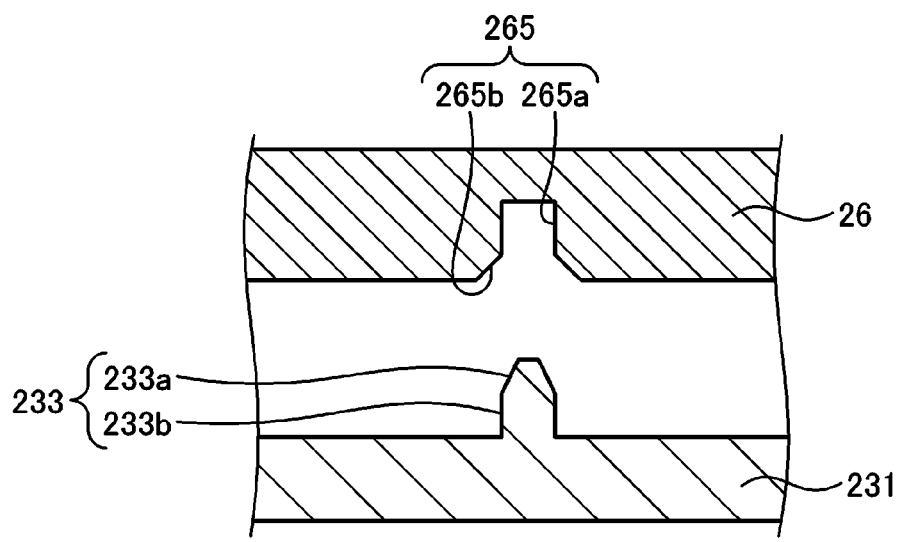
FIG. 13 is an enlarged cross-sectional view showing a further example of the shape of the recess of the mask and the shape of the protrusion of the stage.

Further, the inclined portion may be formed on the side of the protrusion 233, for example, as shown in FIG. 12. FIG. 12 is an enlarged cross-sectional view showing another example of the shape of the protrusion 233 of the stage 23. The protrusion 233 of the stage 23 has a second side wall portion 233b extending from the root of the protrusion 233 in the protruding direction of the protrusion 233, and a second inclined portion 233a formed so that the width of the protrusion 233 becomes narrow from the second side wall portion 233b to the tip of the protrusion 233. Further, the inclined portion may be formed in both the recess 265 and the protrusion 233, for example, as shown in FIG. 13. FIG. 13 is an enlarged cross-sectional view showing another example of the shape of the recess 265 of the mask 26 and the shape of the protrusion 233 of the stage 23.

Figure 14:
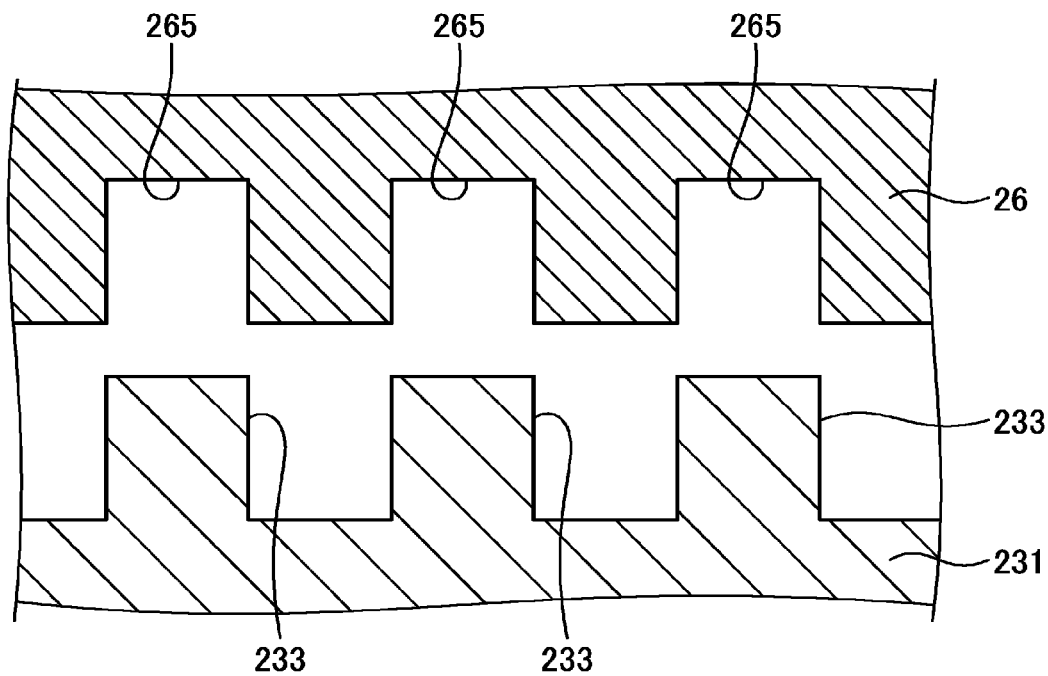
FIG. 14 is an enlarged cross-sectional view showing a still further example of the shape of the recess of the mask and the shape of the protrusion of the stage.

Further, in the above-described embodiment, three sets of recesses 265 and three sets of protrusions 233 are provided along the edge portion of the stage 23. However, the disclosed technique is not limited thereto. As another embodiment, for example, as shown in FIG. 14, plural recesses 265 and plural protrusions 233 may be provided along the edge portion of the stage 23. FIG. 14 is an enlarged cross-sectional view showing another example of the recesses 265 of the mask 26 and the protrusions 233 of the stage 23. In FIG. 14, parts of the mask 26 and the stage 23 in the direction extending along the edge portion of the stage 23 are shown on an enlarged scale. In the example of FIG. 14, it can be considered that both the recesses and the protrusions are formed in the mask 26 and the stage 23 along the edge portion of the stage 23.

In the example of FIG. 14, the distance between the recesses 265 formed in the mask 26 and the distance between the protrusions 233 formed in the stage 23 are set to be equal. Then, by rotating the stage 23 so that the recesses 265 and the protrusions 233 mesh with each other, the vertical distance from the electrostatic chuck 232 to the edge of the opening 262 of the mask 26 can be set to ΔL1. Further, by rotating the stage 23 so that the protrusions 233 come into contact with the portion of the mask 26 where the recesses 265 are not formed, the vertical distance from the electrostatic chuck 232 to the edge of the opening 262 of the mask 26 can be set to ΔL2 longer than ΔL1.

Figure 15:
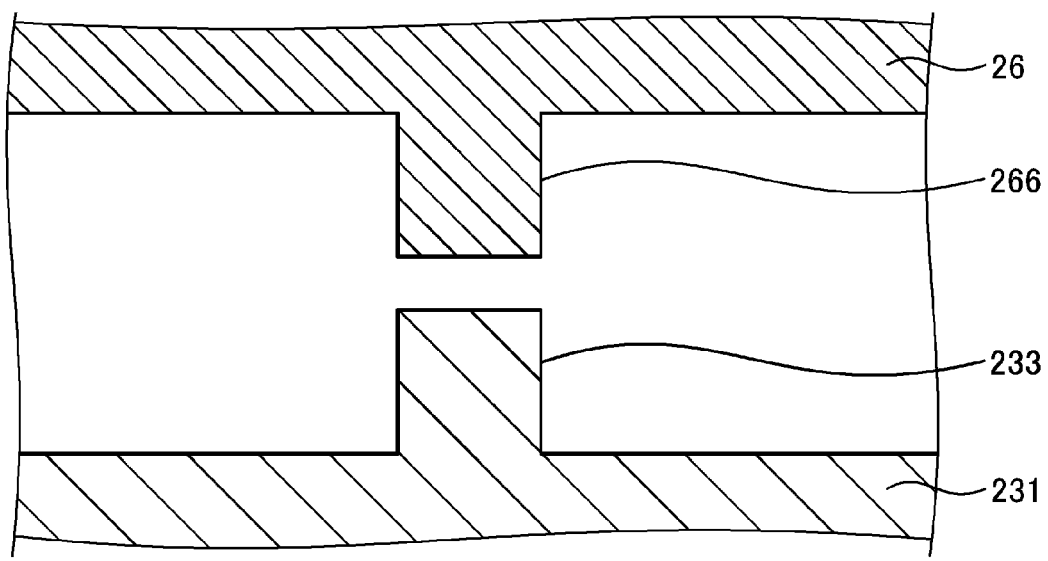
FIG. 15 is an enlarged cross-sectional view showing an example of a mask and a stage when a protrusion is provided in a mask.

Further, in the above-described embodiment, the mask 26 is provided with the recess 265. However, the disclosed technique is not limited thereto. As another form, the mask 26 may have a protrusion 266 formed, for example, as shown in FIG. 15. FIG. 15 is an enlarged cross-sectional view showing an example of the mask 26 and the stage 23 when the mask 26 is provided with the protrusion 266. Even in the configuration shown in FIG. 15, by rotating the stage 23 so that the surface of the mask 26 on which the protrusion 266 is not provided comes into contact with the protrusion 233, the vertical distance between the electrostatic chuck 232 and the edge of the opening 262 of the mask 26 can be set to ΔL1. In addition, by rotating the stage 23 so that the protrusion 266 and the protrusion 233 come into contact with each other, the vertical distance between the electrostatic chuck 232 and the edge of the opening 262 of the mask 26 can be set to ΔL2 longer than ΔL1.

Further, in the above-described embodiment, the process module PM for forming a film by sputtering has been described as an example of the processing apparatus. However, the disclosed technique is not limited thereto. That is, the disclosed technique can be applied to other processing apparatuses such as an etching apparatus and a modifying apparatus as long as they are processing apparatuses for processing the substrate W.

Further, in the above-described embodiment, pre-sputtering has been described as an example of the pretreatment.

However, the disclosed technique is not limited thereto. For example, the disclosed technique can be applied to a pretreatment such as cleaning or seasoning of the inside of the film forming system 1, or the like.

Further, in the above-described embodiment, the distance between the mask 26 and the stage 23 is changed by using the recess 265 provided in the mask 26 and the protrusion 233 provided in the stage 23. However, the disclosed technique is not limited thereto. As another form, the mask 26 may be held at the position where the film forming process is performed, and the driver 24 may raise the stage 23 from the position where the pre-sputtering is performed to the position lower by ΔL than the height of the stage 23 when the film forming process is performed. Even in this case, it is possible to prevent the disc shutter 27 and the mask 26 from interfering with each other when pre-sputtering is performed.

Further, in the above-described embodiment, the disc shutter 27 is thicker than the substrate W. However, the disclosed technique is not limited thereto. As another form, the disc shutter 27 may be thinner than the substrate W as long as it can be made of a material having higher resistance to plasma than the substrate W. When the disc shutter 27 is thinner than the substrate W, the distance ΔL2 between the electrostatic chuck 232 and the edge of the opening 262 of the mask 26 in the pre-sputtering is shorter than the distance ΔL1 between the electrostatic chuck 232 and the edge of the opening 262 of the mask 26 in the film forming process. For example, when the pre-sputtering is performed, by fitting the recess 265 of the mask 26 and the protrusion 233 of the stage 23 to each other, the distance between the electrostatic chuck 232 and the edge of the opening 262 of the mask 26 is set to ΔL2. As a result, the gap between the disc shutter 27 and the mask 26 can be narrowed to almost the same level as the gap between the substrate W and the mask 26 when the film forming process is performed. This makes it possible to reduce damage to the electrostatic chuck 232 which may be caused by the plasma in the pre-sputtering. On the other hand, when the film forming process is performed, the surface of the mask 26 having no recess 265 and the protrusion 233 of the stage 23 are brought into contact with each other to set the distance between the electrostatic chuck 232 and the edge of the opening 262 of the mask 26 to ΔL1 longer than ΔL2. This makes it possible to prevent interference between the substrate W and the mask 26 in the film forming process.

According to the present disclosure in some embodiments, it is possible to improve the substrate processing throughput.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing method performed in a processing apparatus for processing a substrate, comprising:
   a first arrangement step of mounting, on a stage provided in a processing container to mount the substrate on the stage, a plate-shaped protective member which is prepared in advance at a location in the processing container different from a location on the stage and which is configured to protect an upper surface of the stage on which the substrate is mounted;
   an adjustment step of adjusting a distance between the stage and an annular cover member provided above an edge portion of the stage to a second distance different from a first distance between the stage and the cover member when the substrate is processed; and
   a pretreatment step of performing a pretreatment in the processing container to change a state in the processing container to a predetermined state,
   wherein the protective member has a thickness different from a thickness of the substrate, and
   wherein a difference between the first distance and the second distance is equal to a difference between the thickness of the substrate and the thickness of the protective member.

2. The method of claim 1, wherein a target is exposed in the processing container, and pre-sputtering of the target is performed in the pretreatment step.

3. The method of claim 2, wherein in the pretreatment step, the pre-sputtering of the target is performed after a temperature of the protective member is adjusted to a predetermined temperature.

4. The method of claim 3, wherein the protective member is thicker than the substrate,
   a protrusion is formed on the edge portion of the upper surface of the stage,
   a recess is formed on a lower surface of the cover member facing the edge portion of the stage,
   the method further comprises:
   a second arrangement step of mounting the substrate on the stage;
   a first rotation step of rotating the stage so that the protrusion of the stage overlaps with the recess of the cover member when viewed in a direction from the cover member toward the stage;
   a first setting step of setting the distance between the stage and the cover member to the first distance by bringing the stage closer to the cover member and fitting the protrusion of the stage and the recess of the cover member to each other; and
   a processing step of processing the substrate, and
   the adjustment step includes:
   a second rotation step of rotating the stage so that when viewed in the direction from the cover member toward the stage, the protrusion of the stage is arranged at a first position different from a second position of the cover member where the recess is provided; and
   a second setting step of setting the distance between the stage and the cover member to the second distance longer than the first distance by bringing the stage closer to the cover member and bringing the protrusion of the stage into contact with the cover member at the first position different from the second position where the recess is provided.

5. The method of claim 4, wherein the recess includes a first side wall portion extending from a bottom of the recess toward an opening of the recess, and a first inclined portion formed so that a width of the recess increases from the first side wall portion toward the opening of the recess.

6. The method of claim 5, wherein the protrusion has a second side wall portion extending from a root of the protrusion toward a tip of the protrusion, and a second inclined portion formed so that a width of the protrusion decreases from the second side wall portion toward the tip of the protrusion.

7. The method of claim 6, wherein a surface of the protective member in contact with the stage is rougher than the upper surface of the stage.

8. The method of claim 4, wherein the protrusion has a second side wall portion extending from a root of the protrusion toward a tip of the protrusion, and a second inclined portion formed so that a width of the protrusion decreases from the second side wall portion toward the tip of the protrusion.

9. The method of claim 1, wherein the protective member is thicker than the substrate,
- a protrusion is formed on the edge portion of the upper surface of the stage,
- a recess is formed on a lower surface of the cover member facing the edge portion of the stage,
- the method further comprises:
- a second arrangement step of mounting the substrate on the stage;
- a first rotation step of rotating the stage so that the protrusion of the stage overlaps with the recess of the cover member when viewed in a direction from the cover member toward the stage;
- a first setting step of setting the distance between the stage and the cover member to the first distance by bringing the stage closer to the cover member and fitting the protrusion of the stage and the recess of the cover member to each other; and
- a processing step of processing the substrate, and the adjustment step includes:
- a second rotation step of rotating the stage so that when viewed in the direction from the cover member toward the stage, the protrusion of the stage is arranged at a first position different from a second position of the cover member where the recess is provided; and
- a second setting step of setting the distance between the stage and the cover member to the second distance longer than the first distance by bringing the stage closer to the cover member and bringing the protrusion of the stage into contact with the cover member at the first position different from the second position where the recess is provided.

10. The method of claim 1, wherein a surface of the protective member in contact with the stage is rougher than the upper surface of the stage.

11. A processing apparatus, comprising:
- a processing container;
- a stage provided in the processing container to mount a substrate on the stage;
- an annular cover member provided above an edge portion of the stage;
- a transfer part configured to mount, on the stage, a plate-shaped protective member, which is prepared in advance at a location in the processing container different from a location on the stage and which is configured to protect an upper surface of the stage on which the substrate is mounted; and
- an adjustment part configured to, when the protective member is mounted on the stage, adjust a distance between the stage and the cover member to a second distance different from a first distance between the stage and the cover member when the substrate is processed,
- wherein the protective member has a thickness different from a thickness of the substrate, and
- wherein a difference between the first distance and the second distance is equal to a difference between the thickness of the substrate and the thickness of the protective member.

* * * * *